(12) United States Patent
Mason et al.

(10) Patent No.: US 7,919,979 B1
(45) Date of Patent: Apr. 5, 2011

(54) FIELD PROGRAMMABLE GATE ARRAY INCLUDING A NON-VOLATILE USER MEMORY AND METHOD FOR PROGRAMMING

(75) Inventors: Martin Mason, San Jose, CA (US); Theodore Speers, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 12 days.

(21) Appl. No.: 11/336,396

(22) Filed: Jan. 20, 2006

Related U.S. Application Data (60) Provisional application No. 60/645,998, filed on Jan. 21, 2005.

(51) Int. Cl.
*H03K 19/177* (2006.01)
*H01L 25/00* (2006.01)

(52) U.S. Cl. ............................. 326/41; 326/16; 326/47

(58) Field of Classification Search .............. 326/37–41, 326/47, 16; 365/221; 711/163; 714/30, 714/727; 713/182
See application file for complete search history.

(56) References Cited

U.S. PATENT DOCUMENTS

| | | | |
|---|---|---|---|
| 4,758,745 A | 7/1988 | Elgamal et al. | |
| 4,870,302 A | 9/1989 | Freeman | |
| 5,132,571 A | 7/1992 | McCollum et al. | |
| 5,841,867 A | 11/1998 | Jacobson et al. | |
| 5,949,987 A * | 9/1999 | Curd et al. | 716/16 |
| 6,366,117 B1 | 4/2002 | Pang et al. | |
| 6,525,557 B1 * | 2/2003 | McManus et al. | 326/8 |
| 6,651,199 B1 * | 11/2003 | Shokouhi | 714/727 |
| 6,757,844 B1 | 6/2004 | Lulla et al. | |
| 6,828,823 B1 | 12/2004 | Tsui et al. | |
| 6,851,013 B1 | 2/2005 | Larsen et al. | |
| 6,894,527 B1 | 5/2005 | Donlin et al. | |
| 6,925,583 B1 * | 8/2005 | Khu et al. | 714/30 |
| 6,970,392 B1 * | 11/2005 | Au et al. | 365/221 |
| 7,078,929 B1 * | 7/2006 | Draper et al. | 326/16 |
| 7,081,771 B2 | 7/2006 | Agrawal et al. | |
| 7,200,235 B1 | 4/2007 | Trimberger | |
| 7,242,218 B2 | 7/2007 | Camarota et al. | |
| 7,256,610 B1 * | 8/2007 | Balasubramanian et al. | 326/38 |
| 7,284,106 B1 * | 10/2007 | Fernald | 711/163 |
| 7,313,730 B1 * | 12/2007 | Ryser | 714/30 |
| 7,382,155 B2 | 6/2008 | Beal et al. | |
| 2005/0175182 A1 * | 8/2005 | Ueno et al. | 380/277 |
| 2005/0289355 A1 * | 12/2005 | Kitariev et al. | 713/182 |

(Continued)

OTHER PUBLICATIONS

"Lattice Expands Its Revolutionary ispXPLD Family with 1,024 and 256 Macrocell Members", Lattice Semiconductor Corporation, http://www.latticesemiconductor.com/coporate/newscenter/productnews/2003/r03084expsitsrev..., 2 pages, Aug. 4, 2003.

(Continued)

*Primary Examiner* — Rexford N Barnie
*Assistant Examiner* — Crystal L Hammond
(74) *Attorney, Agent, or Firm* — Lewis and Roca LLP (57) ABSTRACT

An integrated circuit includes a programmable logic unit and an on-chip non-volatile memory. A JTAG port, TAP controller circuit, and program/erase control circuitry provide user access to the non-volatile memory for storage of user data. The non-volatile memory may also be used to store device data such as a serial number, product identification number, date code, or security data. Portions of the non-volatile memory may be made unavailable to the user once programmed, while other portions of the non-volatile may remain available for user access.

9 Claims, 6 Drawing Sheets

U.S. PATENT DOCUMENTS

2006/0119384 A1 6/2006 Camarota et al.
2009/0058462 A1 3/2009 Mason et al.

OTHER PUBLICATIONS

*MAX II Device Handbook*, vol. 1, Altera Corporation, Cover Page-A4, Mar. & Jun. 2004.

"Altera Begins Shipping MAX II Devices, Industry's Lowest-Cost CPLDs", Altera Corp., Page URL: http://www.altera.com/corporate/news_room/releases/releases_archive/2004/products/nr-max2_shipping.html, 2 pages, Jul. 20, 2004.

"FPGA Design Security Solution Using MAX II Devices", White Paper, Altera Corporation, pp. 1-7, Sep. 2004, version 1.0.

Office Action dated Mar. 16, 2009 in co-pending in U.S. Appl. No. 12/265,531, filed Nov. 5, 2008 entitled "Field Programmable Gate Array Including a Non-Volatile User Memory and Method for Programming."

Final office action mailed Jun. 21, 2010 in co-pending U.S. Appl. No. 12/265,531, filed Nov. 5, 2008 entitled Field Programmable Gate Array Including a Nonvolatile User Memory and Method for Programming, 11 pages.

* cited by examiner

FIELD PROGRAMMABLE GATE ARRAY INCLUDING A NON-VOLATILE USER MEMORY AND METHOD FOR PROGRAMMING

CROSS-REFERENCE TO RELATED APPLICATIONS

This application claims priority from U.S. Provisional Patent application Ser. No. 60/645,998; filed Jan. 21, 2005.

BACKGROUND OF THE INVENTION

1. Field of the Invention

This invention relates to Field Programmable Gate Arrays (FPGAs). More particularly, this invention relates to a Field Programmable Gate Array having a non-volatile user memory. Still more particularly, this invention relates to configuring an FPGA and storing data in the non-volatile user memory in the FPGA.

2. Background

Programmable logic devices are known in the art. Programmable logic devices include complex programmable logic device (CPLD), Field-programmable gate array (FPGA), and other configurable integrated circuits known in the art. An FPGA is the most complex type of programmable logic device, comprising any number of logic modules, an interconnect-routing architecture and programmable elements that may be programmed to selectively interconnect the logic modules to one another and to define the functions of the logic modules. To implement a particular circuit function, the circuit is mapped into the array and the appropriate programmable elements are programmed to implement the necessary wiring connections that form the user circuit.

An FPGA includes an array of general-purpose logic circuits, called cells or logic blocks, whose functions are programmable. Programmable routing lines link the cells to one another. The cell types may be small multifunction circuits (or configurable functional blocks or groups) capable of realizing Boolean functions of multiple variables. The cell types are not restricted to gates. For example, configurable functional groups typically include memory cells and connection transistors that may be used to configure logic functions such as addition, subtraction, etc., inside of the FPGA. A cell may also contain a plurality of flip-flops. Two types of logic cells found in FPGA devices are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

An FPGA circuit can be programmed to implement virtually any set of digital functions. Input signals are processed by the programmed circuit to produce the desired set of outputs. Such inputs flow from the user's system, through input buffers and through the circuit, and finally back out the user's system via output buffers referred to as input/output ports (I/Os). Such buffers provide any or all of the following input/output (I/O) functions: voltage gain, current gain, level translation, delay, signal isolation, and hysteresis. The input/output ports provide the access points for communication between chips. I/O ports vary in complexity depending on the FPGA.

FPGAs may be customized by a user to perform a wide variety of combinatorial and sequential logic functions. Numerous architectures for such integrated circuits are known. Examples of such architectures are found disclosed in U.S. Pat. No. 4,870,302 to Freeman, U.S. Pat. No. 4,758,745 to El Gamal et al., and U.S. Pat. No. 5,132,571 to McCollum et al., as well as many others. The architecture employed in a particular FPGA integrated circuit will determine the richness and density of the possible interconnections that can be made among the various circuit elements disposed on the integrated circuit and thus profoundly affect its usefulness.

Non-volatile memories, such as flash memories are known in the art. Flash memories are electrically erasable and are generally used to store data where it is undesirable that the data be lost when the device is not connected to a power source. Non-volatile memories are often used to store the configuration data for FPGAs such as SRAM FPGAs that are based on volatile technology. Configuration data may be loaded from a flash memory into an SRAM-based FPGA each time the FPGA is powered up. Other flash memory devices are used in systems to store user data. User data is data generated or used in the operation of an FPGA device, as opposed to configuration data which is used to configure the programmable logic and routing to define the function of the FPGA.

Programmable logic devices available from Lattice Semiconductor Corporation, Hillsboro, Oreg. and Altera Corporation, San Jose, Calif. use on-chip blocks of flash memory to load and control SRAM programmable elements in single chips. For example, the ispXP (eXpanded Programmability) product available from Lattice Semiconductor combines electrically-erasable-programmable-read-only memory (EE-PROM) and SRAM technologies. These types of programmable logic devices add an advantage of not needing a separate non-volatile memory chip, but the SRAM programmable logic configuration still has to be loaded from the non-volatile memory block during power-up.

Figure 1:
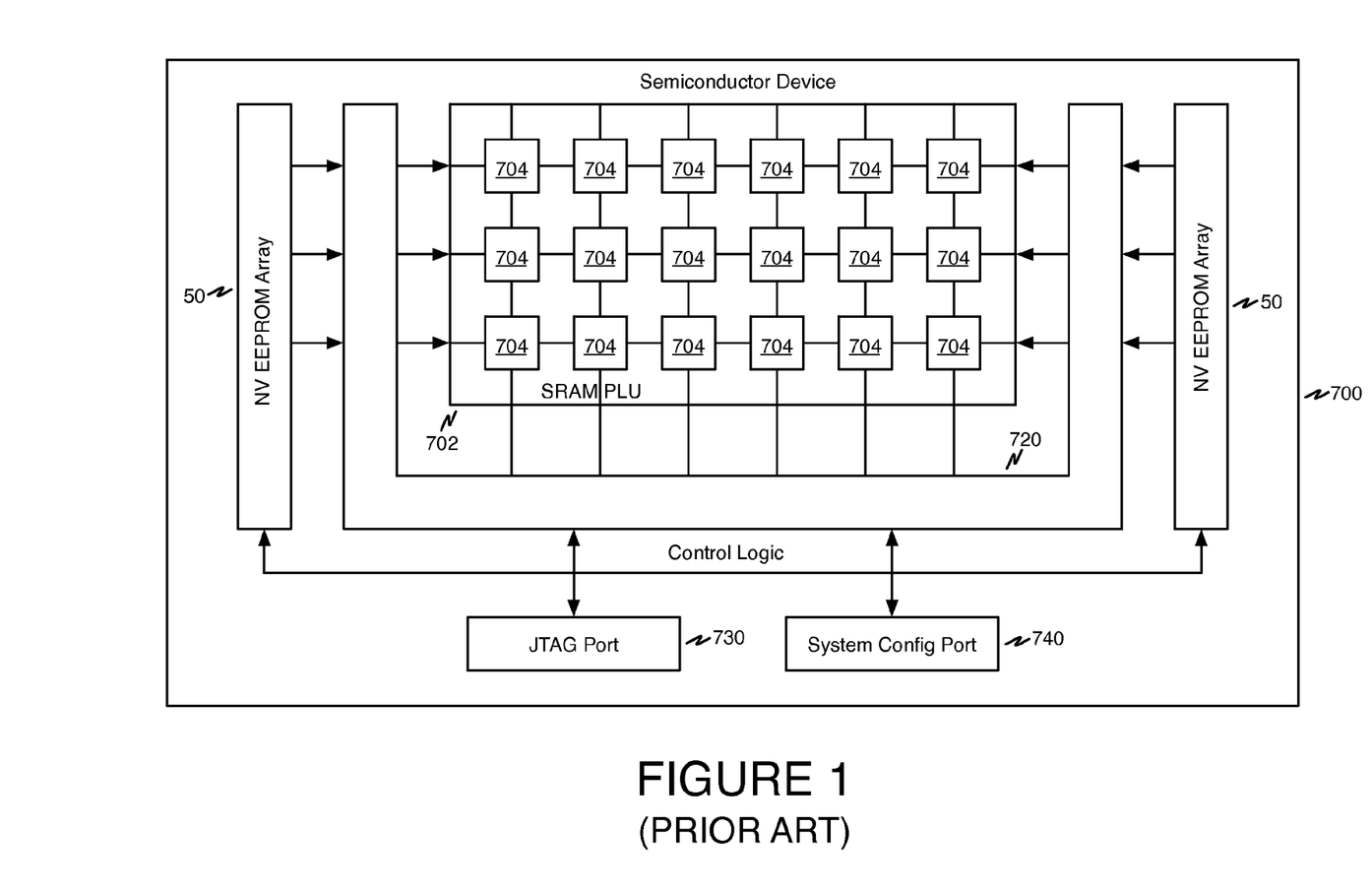
FIG. 1 shows a simplified block diagram of a prior art programmable logic device including an on-chip non-volatile memory.

An example of a semiconductor device 700 employing on-board non-volatile memory to load configuration data into an SRAM programmable logic unit 702 is shown in FIG. 1. Non-volatile EEPROM array 50 stores the device configuration. At power-up, this information is transferred in a parallel fashion into SRAM cells 704 in the programmable logic unit 702. The loading of the configuration data from the non-volatile memory 50 into the SRAM programmable logic 702 may be performed under the control of control logic 720. JTAG port 730 and system configuration port 740 allow for in-system programming.

Field Programmable Gate Arrays (FPGAs) including volatile memories that are available to store user data are known in the art. SRAM-based FPGAs such as those, for example, available from Xilinx Corporation, San Jose, Calif. include SRAM-based volatile memory blocks. Some of these blocks may be available for user data. Even on non-volatile FPGAs, however, such as antifuse-based FPGAs, the memory blocks are volatile (generally SRAM-based). Prior art FPGAs do not, therefore include on-chip non-volatile memories available for storing user data.

It is a problem in FPGAs containing volatile logic and memory that the FPGA must be programmed each time the device is powered up. Thus, the configuration data and any user data must be stored in a memory outside the FPGA. Thus, power up of the FPGA is slow and requires an excessive amount of power in order to receive configuration and user data over the Input/Output (I/O) of the FPGA.

Furthermore, since all the configuration memory and user data must be loaded using the I/O of the FPGA, security of the data is a problem. Security is a problem because the wires connecting the I/O of the FPGA to the system loading the data may be easily tapped. Thus, those skilled in the art are con-

DETAILED DESCRIPTION

This invention relates to a system and method for programming a Field Programmable Gate Array (FPGA) that includes a non-volatile memory. An advantage of the present invention is that configuration data and user data may be loaded at one time into the FPGA. Thus, the configuration data and user data do not need to be loaded at each power up. This reduces the time and power required for power up of the FPGA. Since the configuration data and user data are not required to be loaded at each power up, security of the FPGA data is improved. Portions of the memory may be designated as read-only and may not be subsequently erased or over-written.

In order to provide a non-volatile memory in the FPGA, the memory may be a flash memory and the circuitry of the FPGA may be configured from floating gate transistors. Alternatively, the programmable logic cells for the FPGA and the non-volatile memory may be based on other non-volatile transistors known in the art such as, for example, SONOS, MONOS, silicon nanocrystal, ferro-electric, and solid-electrolyte switching devices, and other types as will be appreciated by persons of ordinary skill in the art. In accordance with this invention, a programming system programs an FPGA having a non-volatile memory in the following manner. The system receives configuration data for programming the non-volatile FPGA and user data to be stored in the non-volatile user memory of the FPGA. Security data for the FPGA may also be received by the system and stored in the non-volatile memory of the FPGA.

In some embodiments of the invention, the user data and security data may be stored in a system memory used to load the FPGA. The system may generate a programming file, for example a STAPL file, which may include the including security data, configuration data, and user data to be programmed into the programmable logic unit and the non-volatile memory then used to load the configuration data and the user data to the non-volatile memory in the FPGA.

In some embodiments in accordance with this invention, the non-volatile memory may be programmed with specific device data and device type data. Specific device data is data that pertains to the particular FPGA. Some examples of specific device data include a device serial number, a date stamp, and an identifier. The device type data is data that pertains to a particular family or product line of FPGAs. Some examples of device type data may include a product identifier code, parameters for a particular function, and values of constants for certain applications performed by the FPGA. The system may read device type data from a first portion of a system memory and the specific device data from another portion of the system memory.

In some embodiments in accordance with this invention, the system may receive an identification of a portion of the non-volatile memory and a designation for the portion of the memory. The portion of non-volatile memory may be a page of memory or multiple pages of memory. The designation may then either be stored in a system file or in circuitry in the FPGA. The designation may indicate that the portion of non-volatile memory is read-only. If a portion of the memory is designated as read-only, the system is prevented from erasing or over-writing the portion of memory.

Figure 2:
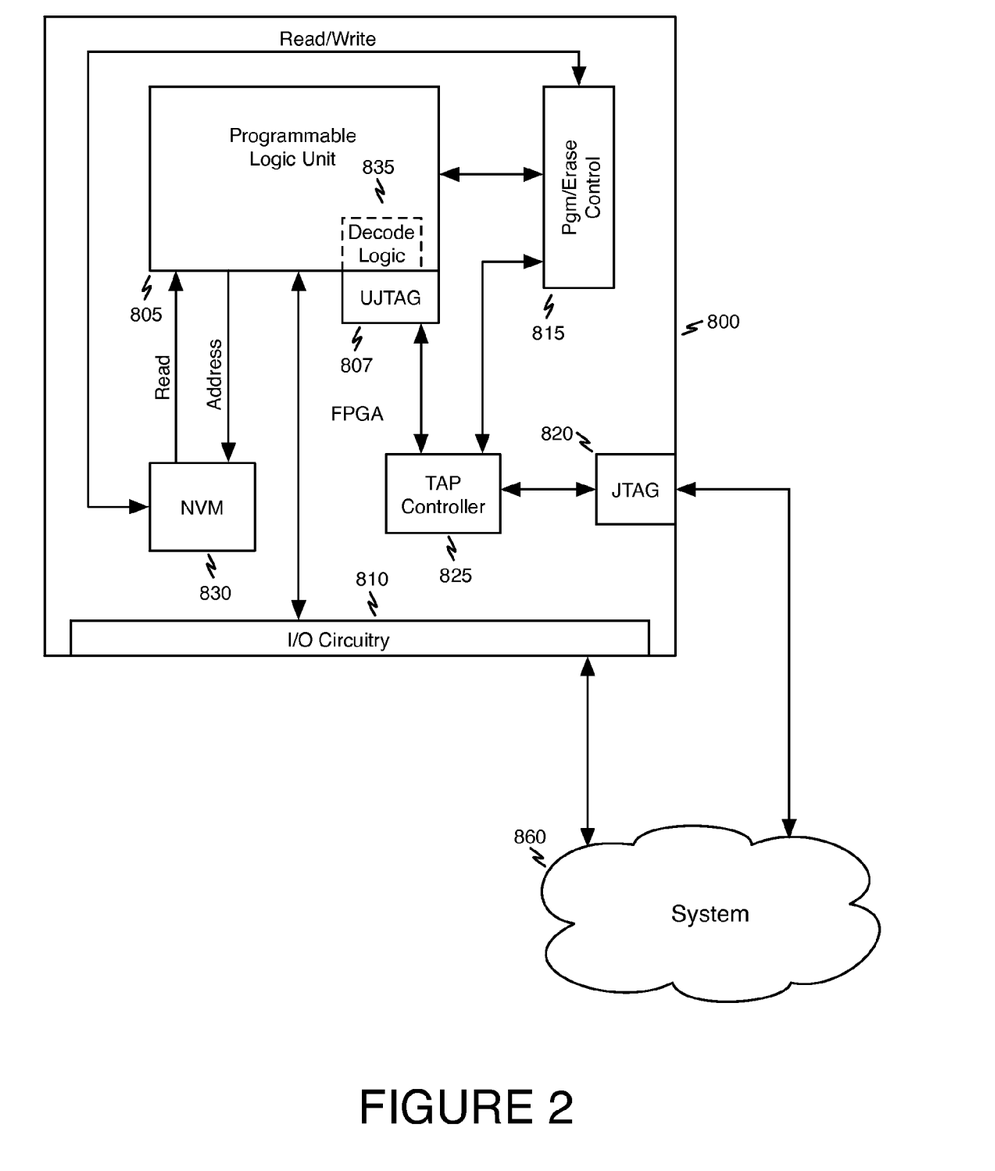
FIG. 2 shows a simplified block diagram of a portion of an FPGA including an on-chip non-volatile memory, in accordance with an embodiment of the present invention.

FIG. 2 illustrates a block diagram of a an FPGA 800 that includes a non-volatile memory 830. FPGA 800 includes a programmable logic unit 805, input/output (I/O) circuitry 810, a JTAG port 820, a TAP controller circuit 825, a program/erase control circuit 815, and a UJTAG port 807. The programmable logic unit (PLU) 805 is a block of programmable logic circuits comprised of programmable logic blocks or "tiles" and routing lines. PLU 805 may be, for example, a non-volatile programmable logic unit such as a flash-based FPGA block. Although the term "flash" often refers to memories, that are bulk erased on a page-by-page, sector-by-sector, or entire array basis, for the purposes of this disclosure "flash" refers to any electrically erasable (and re-programmable) non-volatile memory technology, regardless of the particular erase scheme. Furthermore, although "flash" most commonly refers to memory devices comprised of floating-gate transistors, as used in this disclosure, "flash" includes other non-volatile technologies known in the art such as, for example, SONOS, MONOS, silicon nanocrystal, ferro-electric, and solid-electrolyte switching devices. In one embodiment, the programmable logic cells, of programmable logic unit 805 include non-volatile transistors of the same type as are used in non-volatile memory 830, for example, the non-volatile programmable elements employed in logic unit 805 and non-volatile memory 830 may be comprised of the same types of floating gate transistors.

I/O circuitry 810 is comprised of I/O pins and circuitry that provides connections between an external system 860 and the programmable logic unit 805, for example via I/O tiles (dedicated I/O circuits) of the programmable logic unit (not shown). System 860 may be, for example, other electronic components residing on a circuit board with FPGA 800. JTAG port 820 is comprised of I/O pins and circuits (for example, the same types of circuits as used in I/O 810) that are connected to hardwired circuits on the chip that implement all or part of the JTAG standard (see Joint Test Action Group (JTAG) standard IEEE 1149.1 et seq.). The JTAG port 820 is connected to a TAP controller circuit 825. The TAP controller is a hardwired circuit, for example, a state machine, implementing some or all of the JTAG standard, including the Test Access Port (TAP), and in some embodiments, additional functions implemented through device-specific control logic. The functionality of the TAP controller, including the state diagram, is governed by the JTAG standard, and will not be repeated here to avoid over-complicating the disclosure. The TAP controller is connected to programming/access circuitry 815 and JTAG port 807. Programming/access circuitry 815 is hardwired circuitry that controls programming and erasing of the programmable elements in the programmable logic unit 805 and non-volatile memory block 830 and also includes hardwired circuitry controlling access to the programmable logic unit 805 and non-volatile memory block 830. The programming/access circuitry 815 also controls read operations and manages the signals and voltages required to program the non-volatile memory block 830 and the programmable logic unit 805. The programming/access circuitry 815 may implement all or some of IEEE standard 1532, which specifies how to use JTAG circuits and methods for programming.

JTAG port 820 connects to non-volatile programmable logic unit 805 via TAP controller 825 and a user JTAG (UJTAG) port 807. UJTAG port 807 is a port to the programmable logic portion of the device through which a user may access the programmable logic via the JTAG port 820. UJAG port 807 is a hardwired circuit providing access to the programmable logic unit 805 for signals entering the device via the JTAG port 820. In one embodiment, UJTAG port 807 is comprised of I/O tiles residing on the periphery of the programmable logic unit 805. In another embodiment, UJTAG port 807 is comprised of portions of a group of I/O tiles, while the remainder of those I/O tiles is used for non-JTAG communication into and out of the programmable logic unit 805. The UJTAG port 807 may be defined, and its functionality implemented using decode logic 835. The decode logic 835 is shown in FIG. 2 as implemented in programmable logic (dashed line), however in other embodiments some or all of the decode logic may be hardwired. An important aspect of the UJTAG port design is its connection with the TAP Controller 825 state machine.

As shown in FIG. 2, read, input, and output access to the programmable logic unit 805 is provided to the user of the device via the JTAG port 820, the TAP controller 825, and the UJTAG port 807 and decode logic 835. Write access to the programmable logic unit 805 is provided to the user of the device via the JTAG port 820, the TAP controller 825, and the programming/access circuitry 815. Signals to/from the user and the external system to/from the programmable logic unit 805 may also be provided via the regular I/O circuits 810 directly to the programmable logic unit 805, for example via regular I/O tiles (not shown). As also shown in FIG. 2, read/write access to the non-volatile memory 830 is provided to the user of the device via the JTAG port 820, the TAP controller 825, and the programming/access circuitry 815. The programmable logic unit 805 has read access to the non-volatile memory, as shown in FIG. 2 and, consequently, read access to the non-volatile memory is also provided to the user through the programmable logic unit 805, via regular I/O 810.

The TAP controller 825 may be used as part of the program control circuitry for programming the programmable logic unit 805 of the device. Rather than just using the TAP controller circuitry for programming of the programmable logic, an embodiment of the present invention includes a bi-directional bus interface in the TAP controller so it can read and write data when it is not being used for programming the programmable logic. Since the JTAG port 820 provides a user-accessible connection to off-chip devices, a user may access the non-volatile memory block 830 and the programmable logic block 805, and the I/O circuitry of the device, all via the JTAG port.

In an exemplary embodiment, there is bidirectional access from the JTAG port to the programmable logic unit I/O tiles (not shown) during normal operation of the device. The UJTAG tiles 807 are directly connected to the JTAG Test Access Port (TAP) Controller 825 in normal operating mode. As a result, functional blocks of the device architecture, such as a Clock Conditioning Circuit (CCC) with a phase lock loop (PLL), I/O tiles, and SRAM blocks (not shown) can be reached via the JTAG port.

In one example, the UJTAG functionality is available by instantiating a decode logic macro in the configuration data of a design to instantiate the decode logic 835. In one embodiment write access to the non-volatile memory 830 is only available to the user or the FPGA programmable logic unit 805 via the program/access circuitry 815 (the programmable logic unit 805 FPGA's direct access to the non-volatile memory 830 is read-only). In another embodiment, the programmable logic unit 805 has direct read/write access to the memory, without going through the program/access circuitry 815.

Bidirectional access to the JTAG port 820 from the programmable logic unit 805 creates flexibility to implement many different applications based on importing/exporting data through the UJTAG port 807. Dynamic Reconfiguration of clock conditioning circuits (CCCs), which include PLL, can be performed dynamically through either an embedded shift register or static flash programming switches. These bits control the characteristics of a CCC: routing MUX architectures, delay values, divider values, etc. An embedded shift register (for the dynamic configuration of the CCC) is accessible to the programmable logic unit 805, which, in turn, has access to the UJTAG tiles. Therefore, the CCC configuration shift register can receive and load the new configuration data stream received via the JTAG port 820.

Dynamic reconfiguration eliminates the need to reprogram the device when reconfiguration of the CCC functional blocks is needed. The CCC configuration can be modified while the device continues to operate. The user may be required to design a module to provide the configuration data and control the CCC configuration shift register. In essence, this is a user-designed TAP Controller requiring programmable logic resources.

In some applications, design constants or parameters need to be modified after programming the original design. The tuning process can be done using the UJTAG port without reprogramming the device with new values. If the parameters or constants of a design are stored in distributed registers or embedded SRAM memory blocks, the new values can be shifted onto pins of the JTAG port dedicated to the TAP Controller 825, replacing the old values.

The UJTAG port 807 is used as the "bridge" for data transfer between the JTAG pins 820 (via the TAP controller 825) and the logic blocks of the programmable logic unit 805 or SRAM logic.

In many applications, the design needs to be tested, debugged, and verified on real silicon or in the final embedded application. In order to debug and test the functionality of designs, users may need to monitor some internal logic (or nets) during device operation. The approach of adding design test pins to monitor the critical internal signals has many disadvantages, such as limiting the number of user I/Os. Furthermore, adding external I/Os for test purposes may require additional or dedicated board area for testing and debugging.

The UJTAG port 807 offers a flexible and cost-effective solution for silicon test and debug applications. In this solution, the signals under test are shifted out to the TAP Controller 825.

In one embodiment, all the test signals are monitored through the TAP controller 825—no pins or additional board-level resources are required. In some embodiments of the invention, a device includes embedded volatile memory (for example, an SRAM memory block). In one embodiment, users can initialize an embedded SRAM memory using the UJTAG port where the initialization data is imported using the TAP Controller. In another embodiment, similar functionality is available using the JTAG port.

The contents of the non-volatile memory block 830 are available to the programmable logic unit 805 during normal operation through a read operation. As a result, the decode logic 835 can be used to provide the non-volatile memory block 830 contents to the JTAG port during normal operation.

The non-volatile memory block 830 read address can be provided from outside the device through an input or can be generated internally using the programmable logic unit 805. In either case, data serialization logic may be used and can be designed using the logic of the programmable logic unit. Non-volatile memory contents may be read asynchronously in parallel from the non-volatile memory and shifted out in a synchronous serial format. The TAP state machine may be used to coordinate a data shift procedure.

Figure 3:
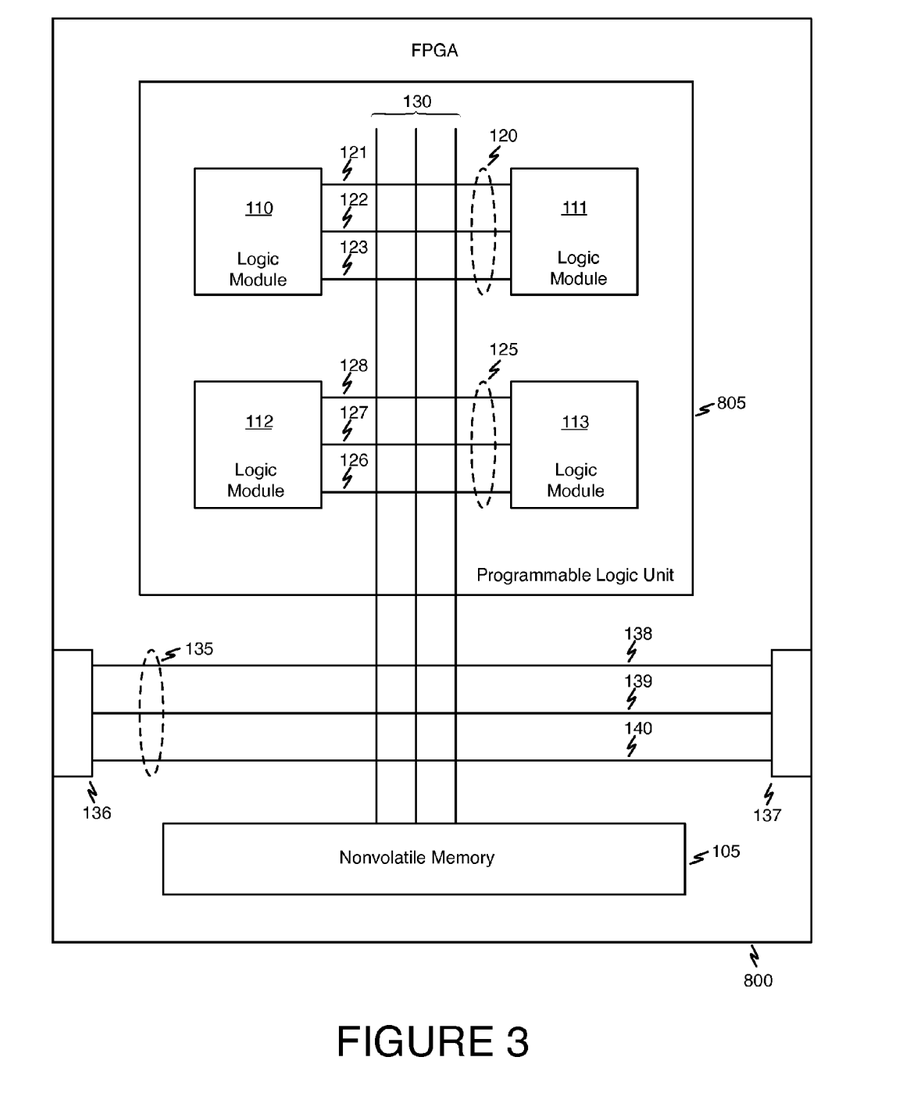
FIG. 3 shows a simplified block diagram of an FPGA including an on-chip user-accessible non-volatile memory, in accordance with an embodiment of the present invention.

FIG. 3 illustrates a block diagram of selected components of an FPGA 800 according to an embodiment of the present invention. FIG. 3 illustrates in more detail an example of a programmable logic unit 805. PLU 805 includes programmable logic modules 110-113. Programmable logic modules 110-113 each include programmable circuitry configurable to perform logic operations on received data. A description of the configuration of the circuitry in logic units is unnecessary to understand this invention and is omitted for brevity.

Inputs and outputs of logic units 110 and 111 are connected to bus 120. In a programmable logic device, busses may be comprised of programmable routing lines that are interconnected according to a user program design. Bus 120 includes routing lines 121-123 which each carry signals. The inputs and outputs of logic units 112 and 113 are connected to bus 125. Bus 125 includes paths 126-128 which each carry a signal. Bus 135 connects inputs/outputs 136 and 137. Bus 135 includes paths 138-140 that each carry a signal. Bus 130 connects to busses 120, 125 and 135. Bus 130 also connects to non-volatile memory 105. One skilled in the art will recognize that each logic unit 110-113 may have separate inputs and outputs connected to separate busses. However, the precise configuration of the circuitry of PLU 805 is not necessary to understand this invention and is omitted for brevity. The busses merely convey how circuitry in PLU 805 may be configured.

Each junction, such as junction 150, at which a routing line in one bus 120, 125, 130 intersects with a corresponding routing line in another bus 120, 125, and 130 includes a switch. By closing the proper configuration of switches, any component of programmable logic unit 805 may be connected to any other component of PLU 805. For non-volatile based PLU's, once logic units are configured by loading configuration data, the logic units do not need to have the configuration data re-loaded on subsequent power ups.

Figure 4:
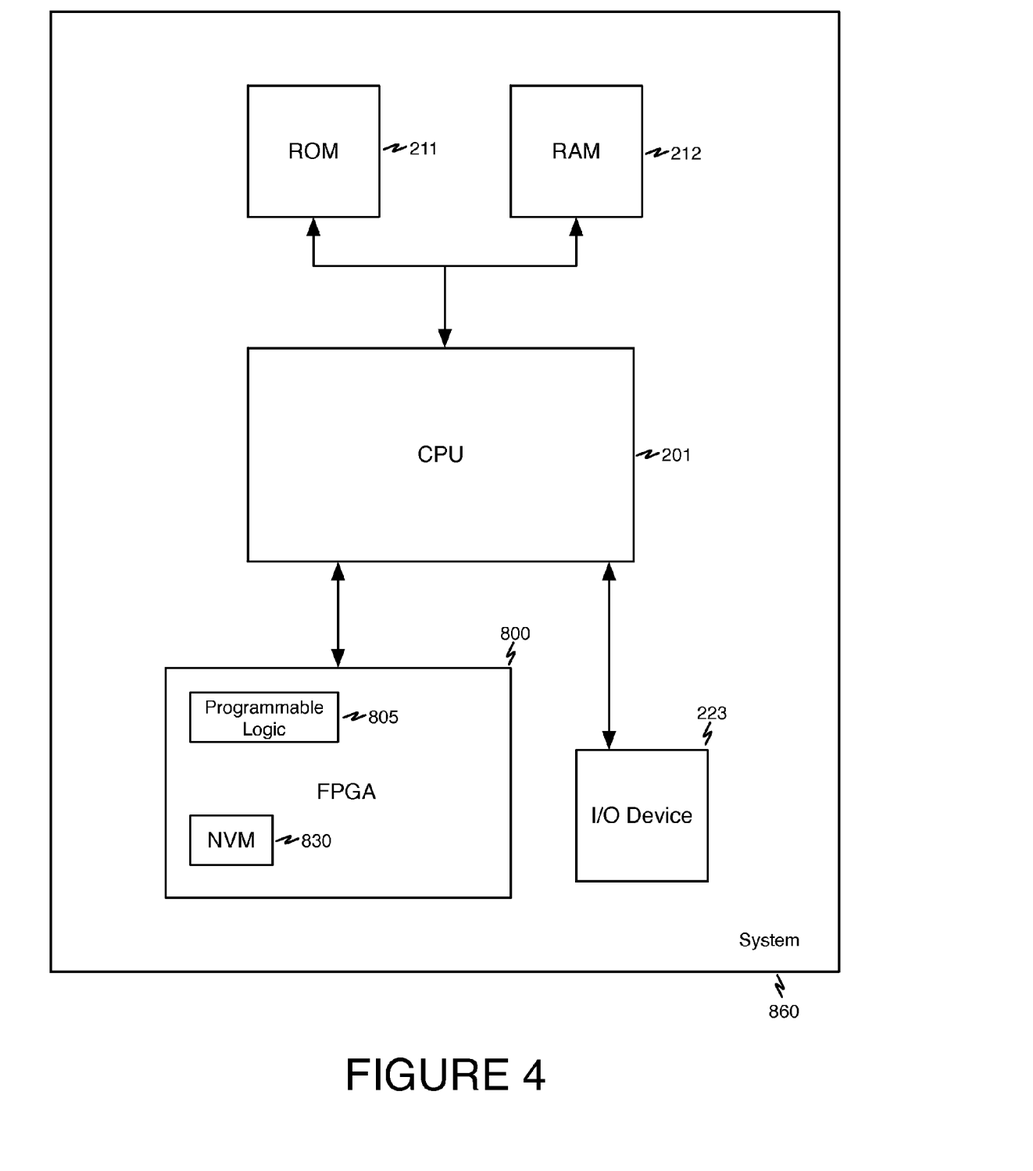
FIG. 4 shows a simplified block diagram of a system including an FPGA with an on-chip user-accessible non-volatile memory, in accordance with an embodiment of the present invention.

FIG. 4 shows an example of a system 860 of which an FPGA 800 may be a part. System 860 is controlled by a central processing unit (CPU) 201, which may be, for example, a microprocessor or microcontroller. CPU 201 is connected to a read-only memory 211, and a random access memory 212. The memories connected to CPU 201 could be any kind of memory from a small SRAM chip to a high-capacity hard disk drive. CPU 201 is also connected to an I/O device 223, which may be any type of circuit or device that generates or receives signals, and may include an analog to digital or digital to analog converter. In one example, I/O device 223 is a keyboard, a pointing device or other device that may be used by a user to input or output data. CPU 201 is also connected to FPGA 800, via the JTAG port, as further described with reference to FIG. 3. CPU 201 can control the programming and erasing of FPGA 800, including the programmable logic unit 805 and non-volatile memory 830.

Figure 5:
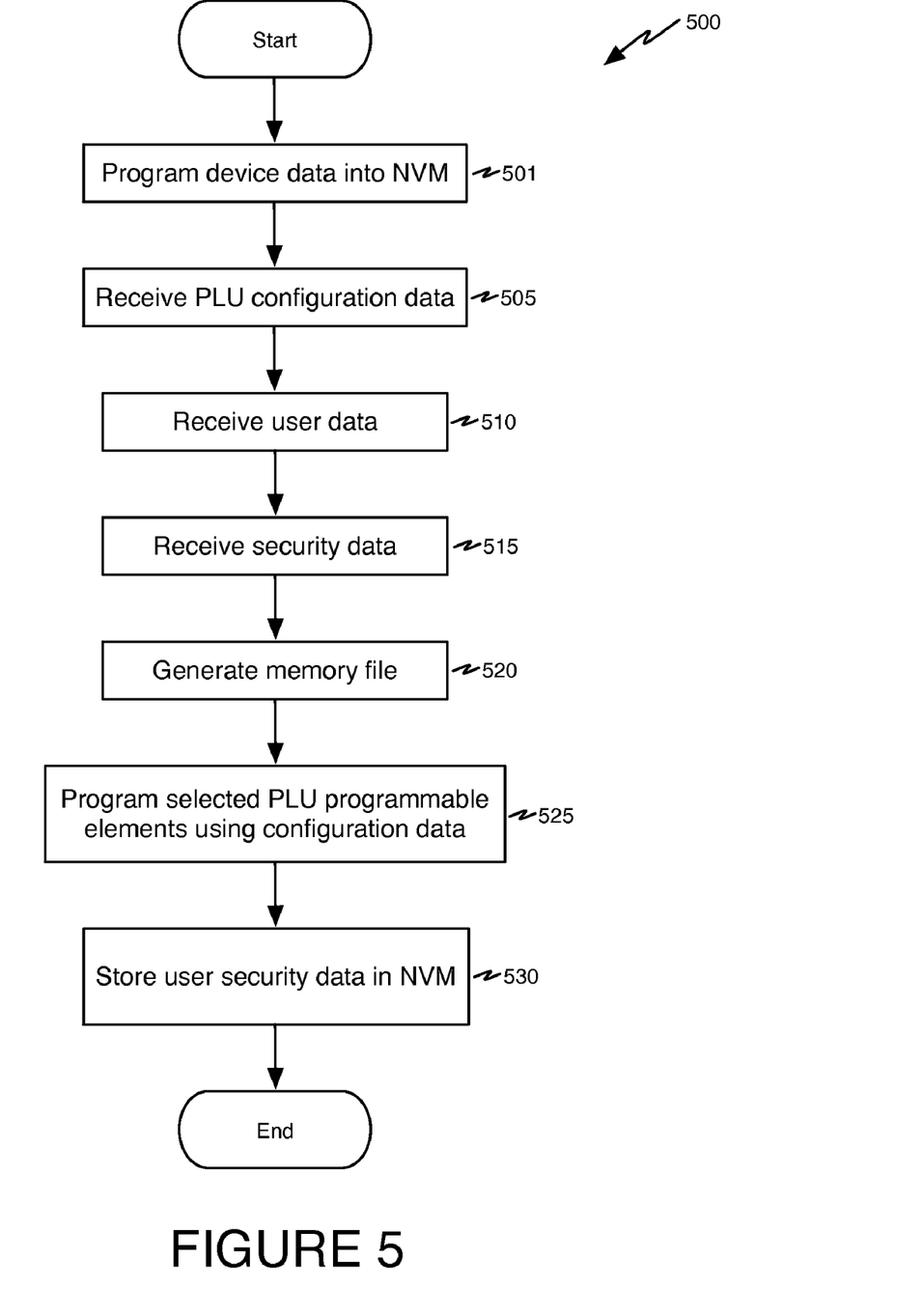
FIG. 5 shows a flow diagram of a method for programming an FPGA including a user-accessible non-volatile memory, in accordance with an embodiment of the present invention.

FIG. 5 illustrates process 500 performed to load configuration data and store user data into programmable logic unit 805 and non-volatile memory 830, respectively, of FPGA 800. Process 500 begins with step 501, in which device data is written into a portion of the non-volatile memory. Device data may include, for example: device specific data such as a serial number, a date stamp, or an identifier; device type data such as a product identifier code, parameters for a particular function, or values of constants for certain applications performed by the programmable logic unit; and security data such as an encryption or decryption key. Programming devices with unique serial numbers can help manufacturers, distributors, and users track devices and inventories.

In some embodiments of the invention, step 501 may include disabling certain types of access to a portion of the non-volatile memory. For example, security bits not accessible to the user may be set to instruct the program/erase control circuitry to disable read, write, and erase access to a portion of the non-volatile memory used by the manufacturer. This would prevent the user, or any other party, from accidentally erasing or over-writing device data such as a serial number, calibration data, etc. Furthermore, it could be used to prevent the user or other party from reading security data such as an encryption or decryption key. In addition, security bits accessible to the user may be used by the manufacturer or user to disable the capability to perform external read/write functions on a portion of the non-volatile memory via the JTAG port. For example, the user may disable JTAG accessibility to a portion of the non-volatile memory after programming user data into the non-volatile memory. Even where external access to the non-volatile memory is disabled, the programmable logic unit may be able to read the data from the non-volatile memory through its read connection.

Step 501 may be performed by the device manufacturer or other (trusted) party before the device is sent to a customer or an unsecure environment for programming. For example, the user may send a device with a secured decryption key along with an encrypted configuration data file to a third party programmer to program the device with the configuration data file. In this case, the third party programmer need not be a trusted party because the programmer will not have access to either the decrypted configuration data file or the decryption key. Decryption of configuration data may be done, for example, with hardwired circuitry such as an AES decryption block in the program/erase control circuitry. Decryption circuitry may also be programmed into the programmable logic unit for implementation of decryption functions by the user.

In step 505 configuration data is received for the programmable logic unit 805 portion of the FPGA 800. The configuration data may be stored in a file read from memory or may be received over a network connection. As stated above, configuration data is data that is applied to circuitry of programmable logic unit 805 to program selected programmable elements to configure the programmable logic and routing to implement a user's logic design.

Figure 6:
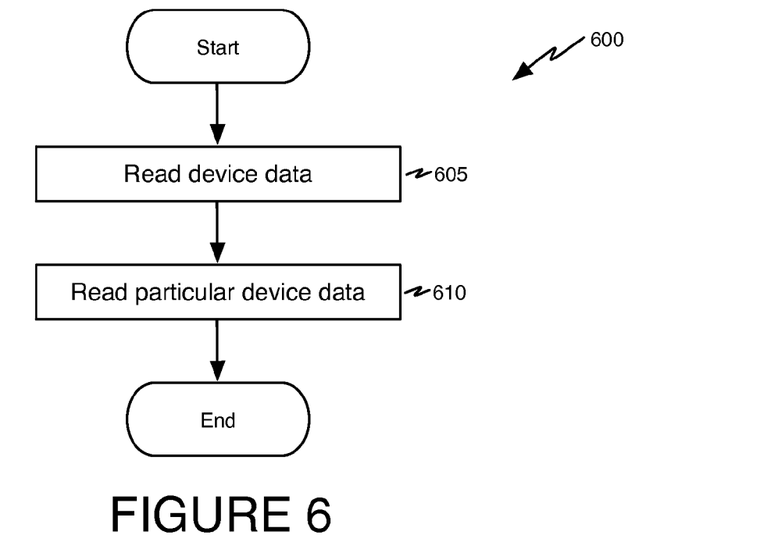
FIG. 6 shows a flow diagram of a method for reading an FPGA including a user-accessible non-volatile memory, in accordance with an embodiment of the present invention.

In optional step 510, user data is received. As stated above, user data is data that is stored in non-volatile memory and conveys information or defines parameters for performance of a function. User data may include device type data and device specific data. Device type data is data that is common to all devices in a product family. Device type data includes, but is not limited to, specific parameters for a function, constants for functions, and other data that may describe the product family of FPGA 800. Device specific data may include, but is not limited to, serial numbers, date stamps and unique identifiers particular to a specific FPGA device, customer, or application. FIG. 6 is described below and shows a method for receiving the user data.

In optional step 515, security data is received. Step 515 would generally be performed when security data was not part of device data received in step 501, however, in some embodiments, additional security data may be received to secure different data (e.g., user data or configuration data) from the data secured by the security data provided in step 501. Security data is data that may be used to secure other data. In some embodiments, the security data may be an encryption or decryption key that may be used to decrypt user data in FPGA 800, for example using AES encryption/decryption or another know encryption/decryption scheme. A memory file may be generated in optional step 520. The memory file may be a file storing user data and security data that may be stored to the non-volatile memory at one time. In some embodiments, the security data may be placed in a file and may be stored in the non-volatile memory prior to storing other data. The security data may then be used to decrypt other received data prior to storage or use in programming.

The memory file may also be stored in a system memory of a processor for future use. Alternatively, the memory file may include the configuration data and the user data or configuration, user, and security data. In these cases, it is preferable that the configuration data is easily separated from the user data for loading and/or editing.

In step 525, the configuration data is loaded into programmable logic unit 805 to configure the circuitry. For purposes of this discussion, circuitry of programmable logic unit 805 includes all logic units and interconnections between the logic units in programmable logic unit 805. In step 530, the user data is stored in the non-volatile memory 830. One skilled in the art will recognize that steps may be preformed in a different order from what is shown in FIG. 4. For example, there may be time user and/or security data is stored in the non-volatile memory prior to storing the configuration data. One particular example of this is when security data is stored prior to other data for use in decrypting other data prior loading. After the configuration data is loaded and the user data is stored, process 500 ends.

In some embodiments, the user data is stored in a system memory of a device that performs the loading of data. In these instances device type data may be stored in a data file in the system memory. The device specific data may then be stored in a database having a separate record for each device. Process 600 illustrated in FIG. 6 is flow diagram of a process for receiving the user data in an exemplary embodiment. Process 600 begins in step 605 by reading the device type data from the user memory. This may include reading a data file storing the device type data. In step 610, the device specific data is read. This may include reading a record for a particular device from a database. After step 610 process 600 ends.

One advantage of a non-volatile memory is that certain portions of the memory may be protected or modified without affecting other portions of the memory. Furthermore, the path used to access portions of memories may be restricted. In most flash memories, the memory is divided into pages. Process 300, illustrated in FIG. 7, takes advantage of this fact to allow designation of portions of the memory to allow different uses of different portions. In a flash memory, a portion may be a page of memory or multiple pages of memory. Process 300 begins in step 305 by receiving an identification of a portion of the non-volatile memory. For example, the identification may identify a page of the memory.

Figure 7:
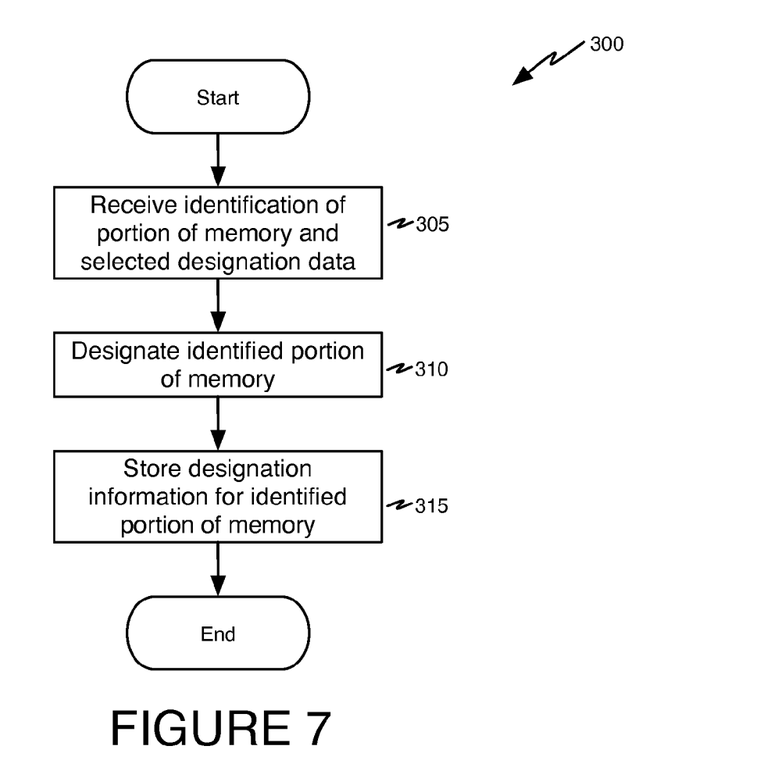
FIG. 7 shows a flow diagram of a method for controlling access to a portion of a non-volatile memory on an FPGA, in accordance with an embodiment of the present invention.

In step 310, a designation for the identified portion of memory is received. Some examples of designations, include but are not limited to, read-only, and read-write. Some other examples include the path that may be used to access the memory. This may include limiting user access to the JTAG port 820, to only accessing the non-volatile memory through the JTAG port 820, or through the I/O port 810 (via the programmable logic unit 805). Another example may include allowing programmable logic unit 805 to read only through direct access and not to read/write through program/access circuitry 815. In this case read/write access through the JTAG port may or may not be enabled. One skilled in the art will recognize that designations may be used for other types of limitations of the paths through which non-volatile memory 830 is accessed.

Access to the non-volatile memory from the JTAG port may be disabled for all or a portion of the memory so that the PLU can control all user access to the memory (e.g., make certain portions read-only). In step 315, the designation is stored, this designation may be stored as part of a data file in system memory storing the user data or may be stored in the configuration logic of programmable logic unit 805. Process 300 then ends.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A programmable logic device integrated circuit comprising:
    a programmable logic unit having programmable logic modules and programmable interconnect elements;
    a non-volatile memory block having a user data portion responsively coupled to the programmable logic unit, and a device-specific data portion;
    a JTAG port;
    program/erase control circuitry coupled to the non-volatile memory block and configurable to deny user access to data stored in the device-specific data portion of the non-volatile memory;
    a TAP controller circuit coupled between the JTAG port and the program/erase control circuitry; and
    a user JTAG port connected between the TAP controller circuit and the programmable logic unit.

2. The programmable logic device of claim 1, wherein the user JTAG port is connected to a portion of the programmable logic unit that is programmed to function as decode logic.

3. The programmable logic device of claim 1, wherein the programmable logic unit is a field programmable gate array programmable logic circuit.

4. The programmable logic device of claim 1, further comprising a non-JTAG input/output connected to the programmable logic unit.

5. The programmable logic device of claim 1, further comprising a read connection between the programmable logic unit and the nonvolatile memory providing address data from the programmable logic unit to the non-volatile memory and read data from the non-volatile memory to the programmable logic unit.

6. The programmable logic device of claim 1 wherein the non-volatile memory block further includes a security-bit portion to store information provided to the program/erase control circuitry to selectively disable a capability to perform external read and write functions to selected portions of the non-volatile memory through the JTAG port.

7. The programmable logic device of claim 1 wherein data stored in the security-bit portion of the non-volatile memory is accessible to a user via the JTAG port and the program/erase control circuitry is configured to allow user access to data stored in the security-bit portion of the non-volatile memory.

8. The programmable logic device of claim 1 wherein the user JTAG port comprises a group of I/O tiles residing on the periphery of the programmable logic unit.

9. The programmable logic device of claim 1 wherein bidirectional access to the JPEG port from the programmable logic unit provides a capability for dynamic reconfiguration of clock conditioning circuits.

\* \* \* \* \*